United States Patent
Nozaki et al.

(10) Patent No.: US 8,507,964 B2
(45) Date of Patent: Aug. 13, 2013

(54) IMAGE SENSOR HAVING WAVEGUIDES FORMED IN COLOR FILTERS

(75) Inventors: Hidetoshi Nozaki, Sunnyvale, CA (US); Fei Wu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/591,058

(22) Filed: Aug. 21, 2012

(65) Prior Publication Data

US 2012/0313206 A1 Dec. 13, 2012

Related U.S. Application Data

(63) Continuation of application No. 12/615,048, filed on Nov. 9, 2009, now Pat. No. 8,269,264.

(51) Int. Cl.
*H01L 31/062* (2012.01)

(52) U.S. Cl.
USPC .................. 257/294; 257/432; 257/E31.127

(58) Field of Classification Search
USPC ................ 257/291, 294, E31.11; 438/57
See application file for complete search history.

(56) References Cited

U.S. PATENT DOCUMENTS

| 7,315,014 B2 | 1/2008 | Lee et al. |
|---|---|---|
| 7,859,033 B2 | 12/2010 | Brady |
| 8,269,264 B2 | 9/2012 | Nozaki et al. |
| 2003/0038326 A1 | 2/2003 | Fasen et al. |
| 2006/0192083 A1 | 8/2006 | Fu et al. |
| 2007/0040102 A1 | 2/2007 | Mouli |
| 2007/0187787 A1 | 8/2007 | Ackerson et al. |
| 2007/0238035 A1 | 10/2007 | Holscher et al. |
| 2008/0036020 A1 | 2/2008 | Ko et al. |
| 2009/0147101 A1 | 6/2009 | Tatani et al. |
| 2009/0189055 A1* | 7/2009 | Lin et al. ............... 250/208.1 |
| 2009/0200625 A1* | 8/2009 | Venezia et al. ............. 257/432 |
| 2009/0272880 A1 | 11/2009 | Stanton et al. |

FOREIGN PATENT DOCUMENTS

| EP | 1 107 316 A2 | 6/2001 |
|---|---|---|
| JP | 2001-237405 A | 8/2001 |

OTHER PUBLICATIONS

CN 201010550429.X—First Chinese Office Action with English translation issued Jul. 31, 2012 (16 pages).
Hsu, T.H. et al., "Light Guide for Pixel Crosstalk Improvement in Deep Submicron CMOS Image Sensor", IEEE Electron Device Letters, Jan. 2004, pp. 22-24, vol. 25, No. 1.
U.S. Appl. No. 12/615,048—Restriction Requirement Office Action, mailed Nov. 1, 2011 (6 pages).
U.S. Appl. No. 12/615,048—Non-Final Office Action, mailed Dec. 2, 2011 (12 pages).
U.S. Appl. No. 12/615,048—Final Office Action, mailed Apr. 24, 2012 (12 pages).
U.S. Appl. No. 12/615,048—Notice of Allowance, mailed Jun. 29, 2012 (8 pages).
EP 10189850—EPO Communication; European Search Report dated Mar. 21, 2013, 5 pages.

* cited by examiner

*Primary Examiner* — Eva Yan Montalvo
(74) *Attorney, Agent, or Firm* — Blakely Sokoloff Taylor & Zafman LLP

(57) ABSTRACT

An image sensor having an array of pixels disposed in a substrate. The array of pixels includes photosensitive elements, a color filters, and waveguide walls. The waveguide walls are disposed in the color filters and surround portions of the color filters to form waveguides through the color filters. In some embodiments, metal walls may be coupled to the waveguide walls.

17 Claims, 8 Drawing Sheets

LIGHT POWER DENSITY FOR OXIDE WAVEGUIDES

BLUE PIXEL 
402

GREEN PIXEL 
404

RED PIXEL 
406

IMAGE SENSOR HAVING WAVEGUIDES FORMED IN COLOR FILTERS

CROSS-REFERENCE TO RELATED APPLICATIONS

This application is a continuation of U.S. application Ser. No. 12/615,048, filed Nov. 9, 2009, now pending, the contents of which are hereby incorporated by reference.

BACKGROUND

1. Field

Embodiments of the present invention relate to image sensors, and in particular, to filters for image sensors.

2. Discussion of Related Art

Conventional image sensors may be fabricated from a complementary metal oxide semiconductor (CMOS) technology or from charge coupled device (CCD) technology. CMOS image sensors include an array of pixels disposed on a substrate, each pixel including a photosensitive element, such as a photodiode, for example, a filter disposed on the photosensitive element, and a micro-lens disposed on the filter. The photosensitive element and a floating diffusion region may be coupled together when an associated transfer transistor is turned on, to transfer the charge from the photosensitive element to the floating diffusion. There may be one or more layers of metal, polysilicon, diffusions, etc., disposed on the substrate as well.

The typical image sensor operates as follows. Light is incident on the micro-lens. The micro-lens focuses the light onto the photosensitive element through the filter. The photosensitive element converts the light into an electrical signal proportional to the intensity of the incident light. The electrical signal may be coupled to amplification and readout circuitry such as a CMOS transistor to generate an image based on the captured light.

Conventional image sensors suffer from some limitations. In image sensors that use front side illumination (FSI), the layers of metal, polysilicon, diffusions, etc., may be disposed between the micro-lenses and the photosensitive elements. During fabrication of image sensors that use FSI technology, a channel must therefore be created for light to travel from the micro-lens to the photosensitive element in an effort to avoid the metal, polysilicon, diffusions, etc.

One solution is to use back side illumination (BSI). In image sensors that use BSI, the layers of metal, polysilicon, diffusions, etc., are on one side of the substrate and the photosensitive elements are on the other side of the substrate. Thus, there is no need to create a path to the photosensitive element that avoids the metal, polysilicon, diffusions, etc. Light is incident on the micro-lens and there is a direct path from the micro-lens and filter to the photosensitive element.

BSI image sensors suffer from limitations as well. For example, as the pixel size of BSI image sensors becomes smaller, it may be difficult for the micro-lens to focus incident light onto the photosensitive element. As a result, there can be crosstalk among the pixels. Crosstalk creates undesirable noise in the image sensor.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION OF EMBODIMENTS

Figure 1:
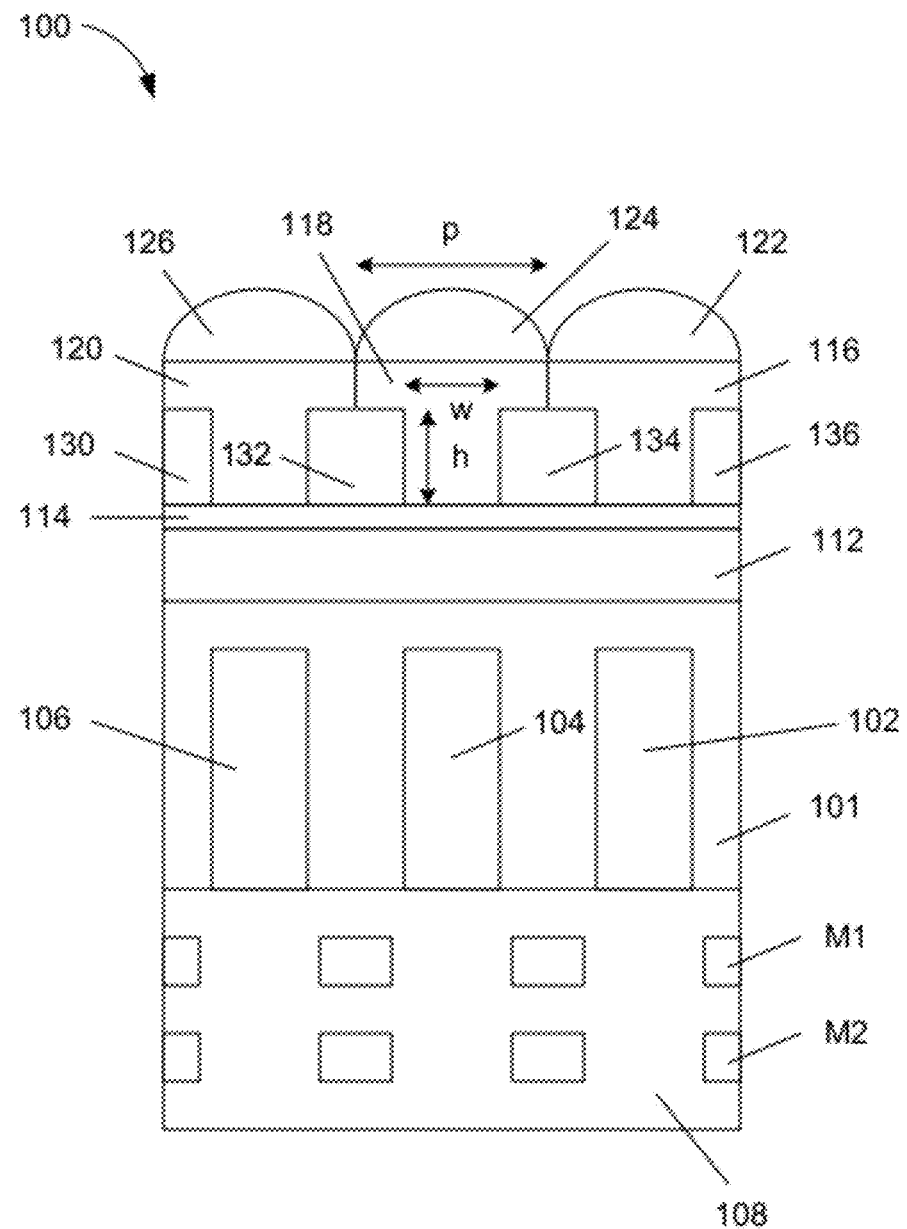
FIG. 1 is a cross-section view of an image sensor according to an embodiment of the present invention.

In the below description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

Embodiments of the present invention include an image sensor having an array of pixels. At least one pixel may include a photosensitive element disposed in a substrate, a color filter disposed on the photosensitive element, and a micro-lens disposed on the color filter. A waveguide wall may surround the color filter. The waveguide wall may be a dielectric material including an oxide such as silicon dioxide ($SiO_2$). Alternatively, the waveguide wall may be an air gap. The refractive index of the waveguide wall may be less than the refractive index of the color filter. The color filter and waveguide wall surrounding the color filter form a waveguide structure, which confines light propagating in the color filter along the waveguide structure. Such confinement reduces light leakage through the waveguide wall surrounding the color filter to neighboring color filters. In other words, the light is guided in the waveguide. The image sensor may be back side illuminated or front side illuminated.

When light is incident on a micro-lens, the micro-lens focuses the light into the color filter. The waveguide structure formed by the color filter and the waveguide wall surrounding the color filter guides the light to the photosensitive element. The photosensitive element converts the light to an electrical signal.

One advantage of embodiments of the present invention is that the crosstalk between pixels may be reduced, because the light entering a color filter is confined in the waveguide formed by the color filter and the waveguide wall surrounding the color filter, and ideally no light escapes the waveguide to enter neighboring pixels. The result is an image sensor with improved capturing of colors. Another advantage is that the image sensor may be more sensitive to incident light because the light entering a color filter is confined in the waveguide, and ideally the light is entirely incident on the photosensitive element. Other features and advantages of the present invention will be apparent from the accompanying drawings and from the detailed description that follows.

FIG. 1 is a cross-section view of an image sensor 100 according to an embodiment of the present invention. In the illustrated embodiment, the image sensor 100 includes an substrate 101. For some embodiments, substrate 101 may be a semiconductor substrate.

In the illustrated embodiment, three photosensitive elements, which are shown as n-photodiodes 102, 104, and 106, are disposed in substrate 101. Generally, image sensor 100 includes several photosensitive elements arranged in a two dimensional array of rows and columns in substrate 101. For purposes of clarity, only photosensitive elements 102, 104, and 106 are illustrated. However, the array can include upwards of thousands of rows and/or columns, or more. Similarly, the array may have an arrangement other than columns and rows.

Typically, an individual pixel in image sensor 100 may include a stack of multiple layers including metal layers, planarization layers, and the like. In the illustrated embodiment, on one side of substrate 101, image sensor 100 includes metal layers having metal conductors M1 and metal conductors M2 disposed in an insulator 108. Insulator 108 may insulate the metal conductors from substrate 101. Insulator 108 may be any dielectric material such as an oxide. For some embodiments, the dielectric material may be a silicon oxide. The metal conductors may be copper, aluminum, an aluminum-copper mixture, tungsten, or other metal suitable for carrying an electrical signal.

On another side of substrate 101, a passivation layer 112 of p+ silicon is disposed on substrate 101 and an optional anti-reflective material 114 is disposed on p+ layer of silicon 112. Generally, p+ layer of silicon 112 has an effect of enhancing the charge collection into n-type photodiodes 102, 104, and 106, and prevents dark current generation at the back surface. Note, in some embodiments, p+ layer 112 is optional. A red filter 116, a green filter 118, and a blue filter 120 are disposed on anti-reflective material 114. A micro-lens 122 is disposed on filter 116, a micro-lens 124 is disposed on filter 118, and a micro-lens 126 is disposed on filter 120. A waveguide wall 130 is partially disposed in blue filter 120. A waveguide wall 132 is partially disposed in blue filter 120 and partially disposed in green filter 118. A waveguide wall 134 is partially disposed in green filter 118 and partially disposed in red filter 116. A waveguide wall 136 is partially disposed in red filter 116. In some implementations, waveguide walls are shorter (thinner) than color filters and are disposed in the color filters as illustrated in FIG. 1. In some implementations, waveguide walls can be substantially as tall (thick) as the color filters.

For some embodiments, image sensor 100 may have the following features. The refractive index of filter 120 is greater than the refractive indices of waveguide walls 130 and 132. The refractive index of filter 118 is greater than the refractive indices of waveguide walls 132 and 134. The refractive index of filter 116 is greater than the refractive indices of waveguide walls 134 and 136. In embodiments in which waveguide walls 130, 132, 134, and 136 are silicon dioxide (SiO2), the refractive index of waveguide walls 130, 132, 134, and 136 may be approximately from 1.46 to 1.49. In embodiments in which waveguide walls 130, 132, 134, and 136 are air gaps between the color filters, the refractive indices of waveguide walls 130, 132, 134, and 136 may be approximately 1.0.

In some embodiments, red filter 116 may have a refractive index of approximately 1.7. Green filter 118 may have a refractive index of approximately 1.55. Blue filter 120 may have a refractive index of approximately 1.6.

Micro-lenses 122, 124, and 126 may have a diameter less than or equal to approximately 1.75 microns (μm).

Waveguide walls 130, 132, 134, and 136 may have the following dimensions. The height (h) may be greater than or equal to approximately 0.1 μm and less than or equal to approximately 1.2 μm. Alternatively, the height (h) may be greater than or equal to approximately 0.2 μm and less than or equal to approximately 0.8 μm.

The distance between adjacent waveguide walls (w) may be greater than or equal to approximately 0.2 μm and less than or equal to approximately 1.6 μm. Alternatively, the distance between adjacent waveguide walls (w) may be greater than or equal to approximately 0.3 μm and less than or equal to approximately 1.2 μm.

In some embodiments, the relationship between the pixel pitch (p) and the distance between adjacent waveguide walls (w) is as follows. The distance w is greater than p/10 and less than 9p/10. Alternatively, w is greater than p/6 and less than 5p/6. For some embodiments, the pixel pitch (p) may be less than or equal to approximately 1.75 μm. Alternatively, the pixel pitch (p) may be less than or equal to approximately 1.4 μm.

The cross-section of the waveguide wall surrounding a color filter may have the shape of a square, rectangle, triangle, trapezoid, circle, polygon, ellipse, or other suitable shape. The waveguide walls may form a grid/lattice for square/rectangle color filters.

In one embodiment, image sensor 100 operates as follows. Light is incident on micro-lens 126, which focuses light into blue filter 120. Blue filter 120 filters the incident light and passes the blue light. The waveguide formed by filter 120 surrounded by waveguide walls 130 and 132 guides and passes the blue light to photosensitive element 106, optionally through anti-reflective material 114 and p+ layer of silicon 112. Because the refractive index of blue filter 120 is greater than the refractive indices of waveguide walls 130 and 132, waveguide walls 130 and 132 may sufficiently bend the blue light so the blue light is confined within blue filter 120. Without waveguide walls 130 and 132, the blue light may escape blue filter 120 to enter the neighboring pixels.

This invention utilizes the effect of the total internal reflection which occurs at the interface between the waveguide wall and the color filter. When light is incident on the waveguide wall with an incident angle to the wall larger than a critical angle ($\theta_c$), the light is reflected at the interface. The critical angle is defined as:

$$\theta_c = \sin^{-1}\frac{n_2}{n_1},$$

where $n_2$ refers to refractive index of the waveguide wall and $n_1$ refers to the refractive index of the color filter.

Micro-lens 124 focuses light into green filter 118. Green filter 118 filters the incident light and passes the green light. The waveguide formed by filter 118 surrounded by waveguide walls 132 and 134 guides and passes the green light to photosensitive element 104, optionally through anti-reflective material 114 and p+ layer of silicon 112. Because the refractive index of green filter 118 is greater than the refractive indices of waveguide walls 132 and 134, waveguide walls 132 and 134 may sufficiently bend the green light so the green light is confined within green filter 118. Without waveguide walls 132 and 134, the green light may escape green filter 118 to enter the neighboring pixels.

Micro-lens 122 focuses light into red filter 116. Red filter 116 filters the incident light and passes the red light. The waveguide formed by filter 122 surrounded by waveguide walls 134 and 136 guides and passes the red light to photosensitive element 102, optionally through anti-reflective material 114 and p+ layer of silicon 112. Because the refractive index of the filter 116 is greater than the refractive indices of waveguide walls 134 and 136, waveguide walls 134 and 136 may sufficiently bend the red light so the red light is confined within red filter 116. Without waveguide walls 134 and 136, the red light may escape red filter 116 to enter the neighboring pixels.

Photosensitive elements 102, 104, and 106 convert the red, green, and blue light, respectively, to electrical signals. The electrical signal have a magnitude that is proportional to the intensity of the received light. The electrical signal may be coupled to amplification and readout circuitry such as a CMOS transistor (not shown), for example, to generate an image based on the captured light.

The micro-lenses as well as the filters may be disposed using any suitable deposition, etching, or masking technique, as well as planarization, heating, reflow, chemical vapor deposition (CVD), plasma enhanced chemical vapor deposition (PECVD), or other suitable techniques. Similarly, waveguide walls made of silicon dioxide may be disposed using any suitable deposition, etching, or masking technique, as well as heating, chemical vapor deposition (CVD), plasma enhanced chemical vapor deposition (PECVD), etc.

Waveguide walls formed of an air gap may be fabricated by etching away already disposed silicon dioxide waveguide walls with diluted hydrogen fluoride. Alternatively, the waveguide walls of air gap may be disposed by etching away suitable organic or inorganic compounds such as photo-resist, polyimide and plastic with suitable etchant, stripper and solvent.

Filters 116, 118, and 120 may be arranged in any suitable pattern. In an embodiment in which filters 116, 118, and 120 are color filters, filters 116, 118, and 120 may be arranged in a Bayer pattern. Filters 116, 118, and 120 may be made from any suitable material. One suitable material is an acrylic. Polymethylmethacrylate (PMMA) or polyglycidylmethacrylate (PGMA) that has been pigmented or dyed is suitable for embodiments in which the filters are color filters. Other photoresist-type materials that can be dyed or pigmented may also be used for embodiments in which the filters are color filters.

In the illustrated embodiments, filters 116, 118, and 120 are red, green, and blue filters, respectively. For other embodiments, the filters may be cyan, magenta, yellow, or other suitable colors.

For some embodiments, when the light incident angle with respect to the individual micro-lens is not 0° (see FIG. 2), the focused light is shifted from the center of the corresponding photosensitive element. As the light incident angle with respect to the micro-lens becomes larger, some of the light is not properly focused onto the light sensitive elements, which causes light to be lost and pixel response to decrease. At large incident angle, the pixel response drops below a certain percentage (e.g., 80%) of its 0° angle response where the pixel is perpendicular to the incident light. The incident angle of the light near the center of the image sensor is near 0°. However for pixels positioned further away from the center of the image sensor, the light incident angle increases (not 0°).

Figure 2:
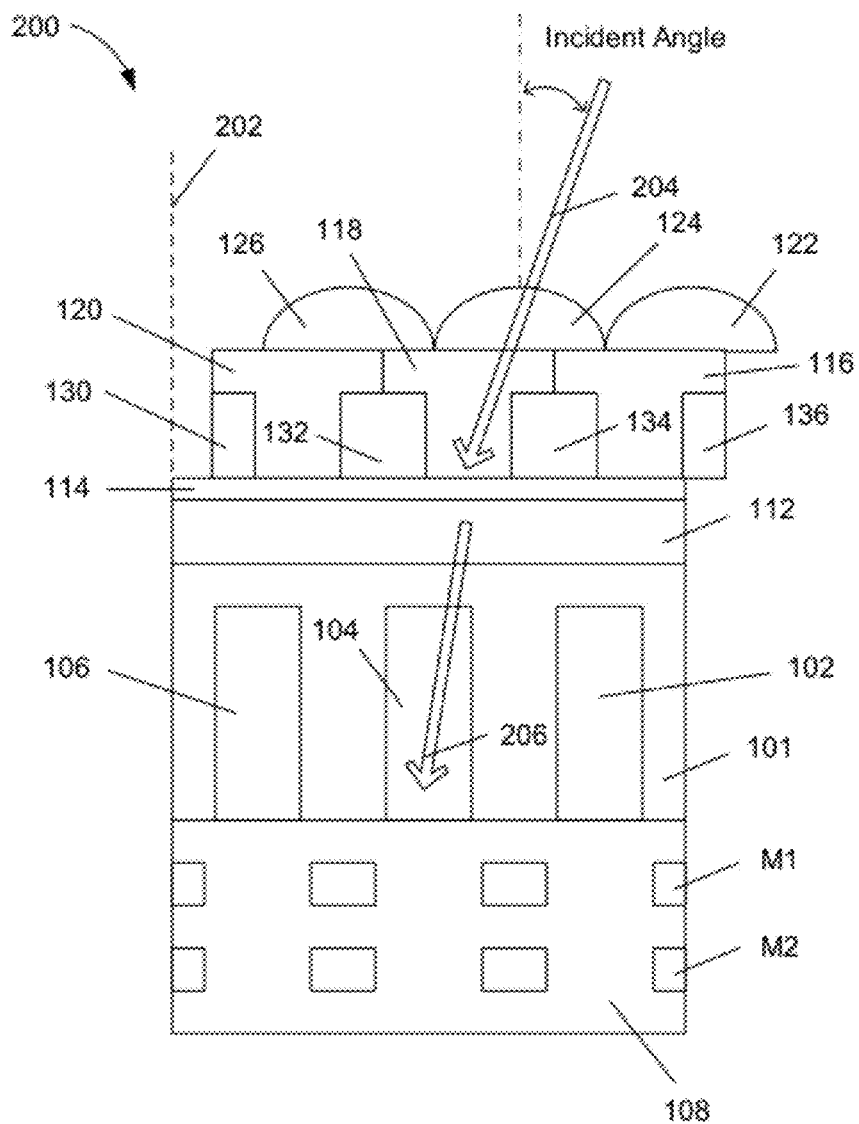
FIG. 2 is a cross-section view of an image sensor according to an embodiment of the present invention.

FIG. 2 is a cross-section view illustrating an image sensor 200 according to an alternative embodiment of the present invention in which the changing angles of incidence may be compensated. For illustration, three pixels in proximity to a left edge 202 of image sensor 200 are shown in FIG. 2. The incident light is not perpendicular to the pixels in proximity to the left edge of image sensor 200. However, the incident light is perpendicular to pixels in proximity to the center of image sensor 200 (not shown). The incident light is tilted to left as shown in FIG. 2. In the illustrated embodiment, the micro-lenses, filters, and waveguide walls are shifted away from left edge 202 of image sensor 200. This is to compensate for the incident light, which is off-axis (incident angle is not 0°) with respect to the individual micro-lens or the individual pixel in proximity to the left edge. As a result, image sensor 200 may have improved response in proximity to the left edge.

Similar to image sensor 100 illustrated in FIG. 1, the embodiment illustrated in FIG. 2 also includes three n-photodiodes 102, 104, and 106, disposed in substrate 101, metal layers having metal conductors M1 and metal conductors M2 disposed in insulator 108 on one side of substrate 101, and p+ layer of silicon 112 is on another side of substrate 101. Optional anti-reflective material 114 is disposed on p+ layer of silicon 112. Filters 116, 118, and 120 are disposed on anti-reflective material 114. Waveguide walls 130, 132, 134, and 136 are disposed in filters 120, 118, and 116.

Embodiments illustrated in FIG. 2 differ from FIG. 1 in that filters 116, 118, and 120, together with waveguide walls 136, 134, 132, and 130 are shifted away from a left edge 202 of image sensor 200. Micro-lenses 122, 124, and 126 are shifted further away from left edge 202 than are the filters and waveguide walls. As a result, if light 204 is incident on micro-lens 124 off-axis (incident angle is not 0°) as shown in FIG. 2, micro-lens 124 can still properly focus the incident light onto photosensitive element 104. In the illustrated embodiment, light 204 coming into the shifted micro-lenses off-axis is further bent into light 206. Light 206 is then incident on photosensitive element 104.

Figure 3:
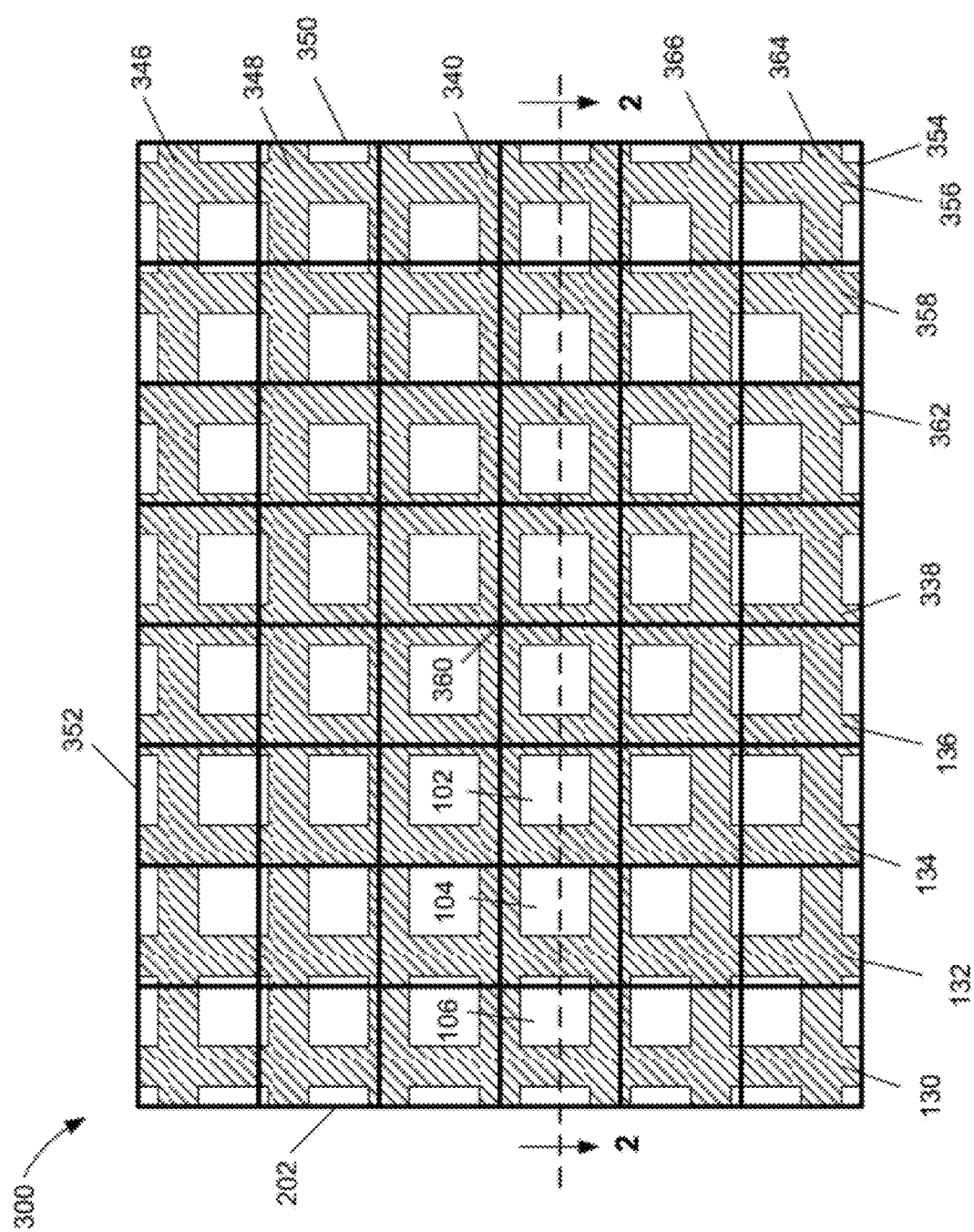
FIG. 3 is a plan view of an image sensor according to an embodiment of the present invention.

FIG. 3 is a plan view of an image sensor 300 according to an embodiment of the present invention illustrating how to offset waveguide walls to compensate for "shading" (off-axis incident light) of the pixels along the periphery of the array. Generally, image sensor 300 includes several photosensitive elements arranged in an array of two dimensional rows and columns in a substrate. For purposes of clarity, a limited number of photosensitive elements are illustrated. However, the array can include upwards of thousands of rows and/or columns, or more. Similarly, the array may have an arrangement other than columns and rows.

Similar to FIG. 2, the embodiment illustrated in FIG. 3 includes photosensitive elements 106, 104, and 102 in proximity to left edge 202. Waveguide walls 130 and 132 are associated with photosensitive element 106. Waveguide walls 132 and 134 are associated with photosensitive element 104. Waveguide walls 134 and 136 are associated with photosensitive element 102. In addition to left edge 202, image sensor 300 has a right edge 350, a top edge 352, a bottom edge 354, and a center 360, with reference to FIG. 3.

As discussed previously, the pixels in proximity to the edges of the array may receive light off-axis, and the focused light is shifted from the center of their respective photosensitive elements. In the illustrated embodiment, waveguide walls 130 and 132 of photosensitive element 106 are shifted away from left edge 202 with reference to photosensitive element 106, to allow light that may be incident off-axis to be guided to photosensitive element 106 with reduced crosstalk into neighboring pixels.

Waveguide walls 132 and 134 of photosensitive element 104 may be shifted away from left edge 202 with reference to photosensitive element 104, to allow light that may be incident off-axis to be guided to photosensitive element 104 with reduced crosstalk into neighboring pixels. However, the shift of waveguide wall 134 away from left edge 202 with reference to photosensitive element 104 may be less than the shift of waveguide walls 130 and 132 away from left edge 202 with reference to photosensitive element 106, because the light incident on the pixel associated with photosensitive element 104 although off-axis may be incident closer to the center of photosensitive element 104 as compared with the light incident on the pixel associated with photosensitive element 106. Therefore, the distance between two adjacent waveguide walls may decrease as the pixel is located further away from a center 360 of image sensor 300 and getting closer to left edge 202.

Waveguide walls 338 and 340 passing through center 360 of image sensor 300 may not be shifted at all because light may be incident on-axis (incident angle is 0°).

In the illustrated embodiment, waveguide walls 356 and 358 are shifted away from right edge 350 to allow light that may be incident off-axis near edge 350 to be guided to the corresponding photosensitive element with reduced crosstalk into neighboring pixels.

Waveguide wall 362 may be shifted away from right edge 350 to allow light that may be incident off-axis to be guided to the corresponding photosensitive element with reduced crosstalk into neighboring pixels. However, the shift of waveguide wall 362 away from right edge 350 may be less than the shift of waveguide walls 356 and 358 away from the right edge 350. Therefore, the distance between two adjacent waveguide walls may decrease as the pixel is further away from center 360 of image sensor 300 and getting closer to right edge 350.

In the illustrated embodiment, waveguide walls 364 and 366 are shifted away from a bottom edge 354 to allow light that may be incident off-axis near edge 354 to be guided to the corresponding photosensitive element with reduced crosstalk into neighboring pixels. Similarly, the distance between two adjacent waveguide walls may decrease as the pixel is further away from center 360 of image sensor 300 and getting closer to bottom edge 354.

In the illustrated embodiment, waveguide walls 346 and 348 are shifted away from a top edge 352 to allow light that may be incident off-axis near edge 352 to be guided to the corresponding photosensitive element with reduced crosstalk into neighboring pixels. Similarly, the distance between two adjacent waveguide walls may decrease as the pixel is further away from center 360 of image sensor 300 and getting closer to top edge 352. Although shown as a grid pixel architecture, embodiments of the present invention may include other pixel architectures.

Figure 4:
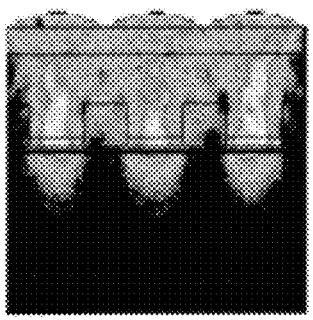
FIG. 4 is a side view of an image sensor illustrating computer-simulated light power density for oxide based waveguides according to an embodiment of the present invention.
Figure 4:
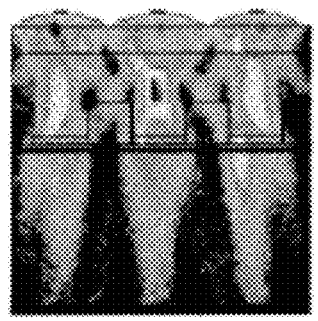
Figure 4:
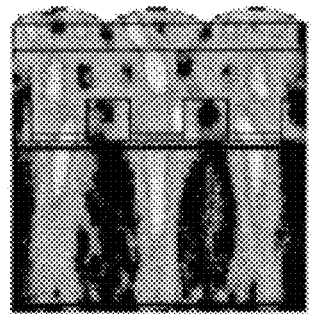

FIG. 4 is a side view of an image sensor 400 illustrating computer-simulated light power density for oxide based waveguides according to an embodiment of the present invention. FIG. 4 illustrates the light power density of blue pixels 402, green pixels 404, and red pixels 406 for an image sensor that uses oxide based waveguides. In the illustrated embodiment, the differences of the refractive indices between the waveguide wall and the color filter are about 0.12, 0.07 and 0.22 for blue, green and red color filters, respectively. The refractive index of waveguide wall is less than the refractive index of the color filter in order to form a waveguide structure. The smaller the refractive index of the waveguide wall, the smaller is the critical angle it produces. The smaller the critical angle, the more light it may guide into the waveguide. Although FIG. 4 illustrates that the red pixel focuses better than green and blue pixels, all pixels focus light much better than in the case of conventional sensors (not shown) without waveguide walls.

Figure 5:
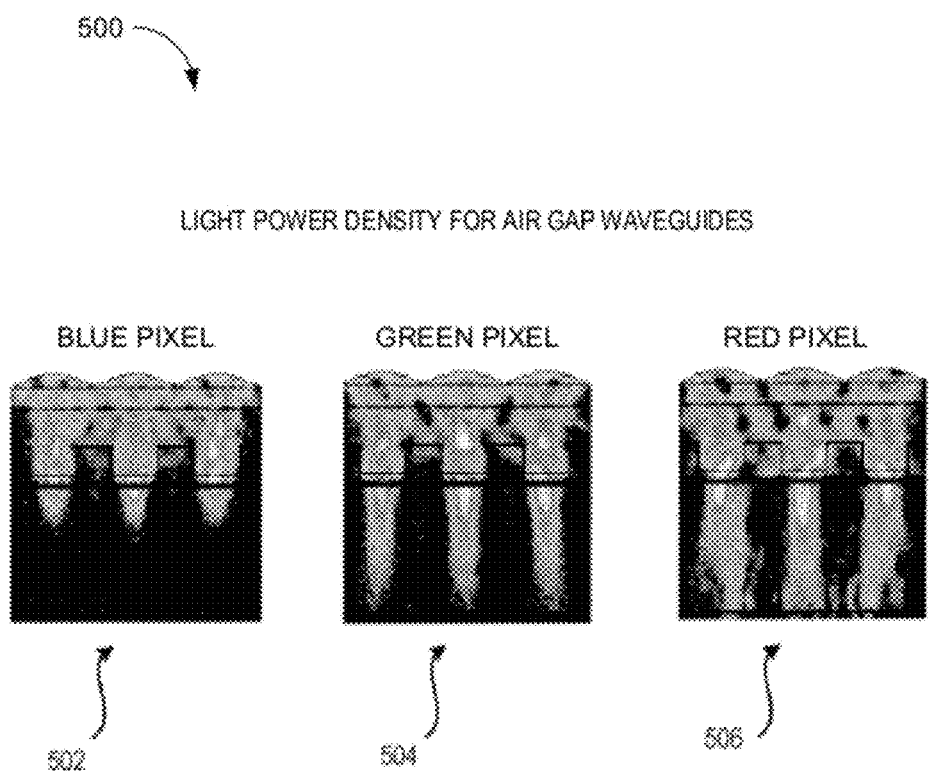
FIG. 5 is a side view of an image sensor illustrating computer-simulated light power density for air gap based waveguides according to an embodiment of the present invention.

FIG. 5 is a side view of an image sensor illustrating computer-simulated light power density of air gap based waveguides according to an embodiment of the present invention. FIG. 5 illustrates the light power density of blue pixels 502, green pixels 504, and red pixels 506 for an image sensor that uses one or more air gaps as waveguide walls. In the embodiment illustrated in FIG. 5, the differences of the refractive indices between the waveguide walls and the color filters are about 0.6, 0.55 and 0.7 for the blue, green and red color filters, respectively. For some embodiments, an air gap may be a preferred choice because its refractive index may be as small as unity, which is the smallest value of refractive index.

Figure 6:
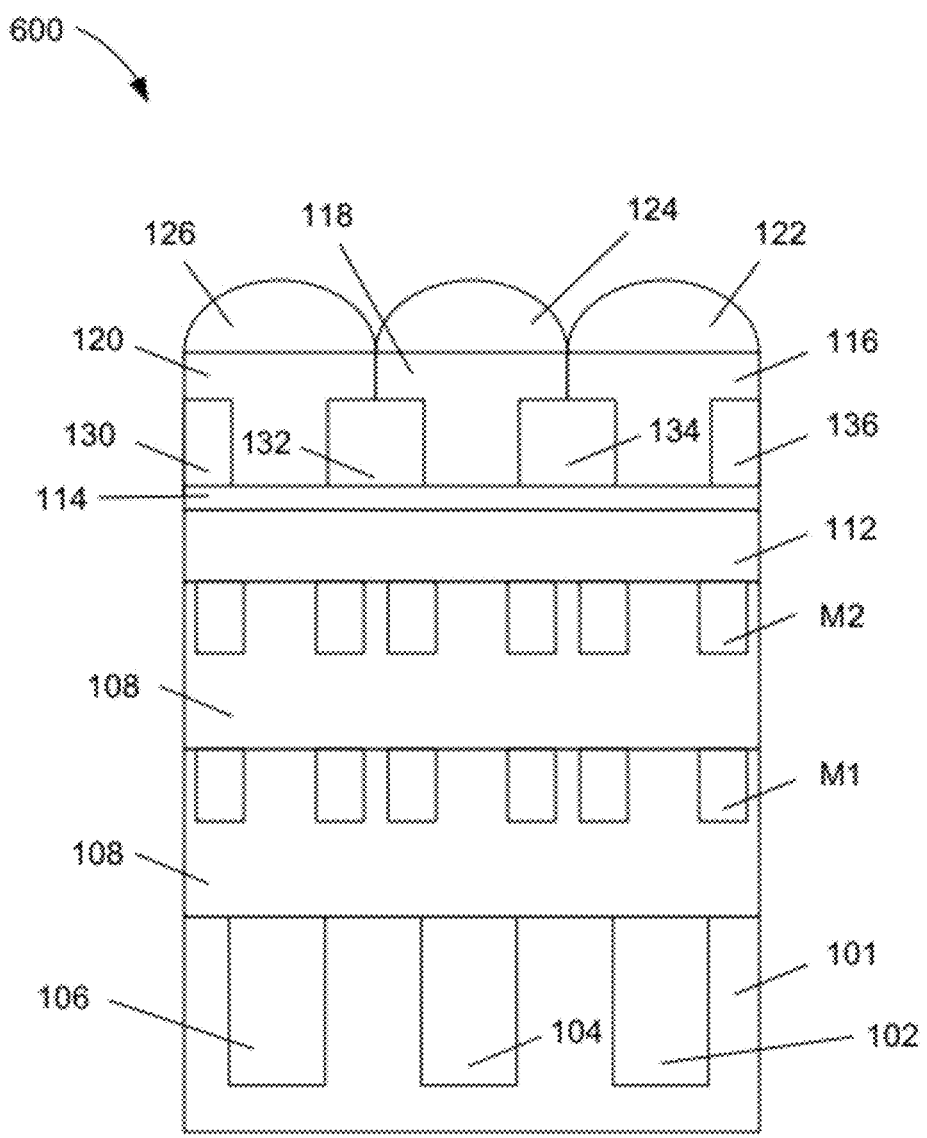
FIG. 6 is a cross-section view of an image sensor according to an embodiment of the present invention.

FIG. 6 is a cross-section view of an image sensor 600 according to an embodiment of the present invention. Image sensor 600 is similar to image sensor 100 except that image sensor 600 is front side illuminated where as image sensor 100 is back side illuminated. Like components are labeled with like reference numbers, although their orientation and relative positions within image sensor 600 are different (as illustrated) due to the front side illumination configuration.

Figure 7:
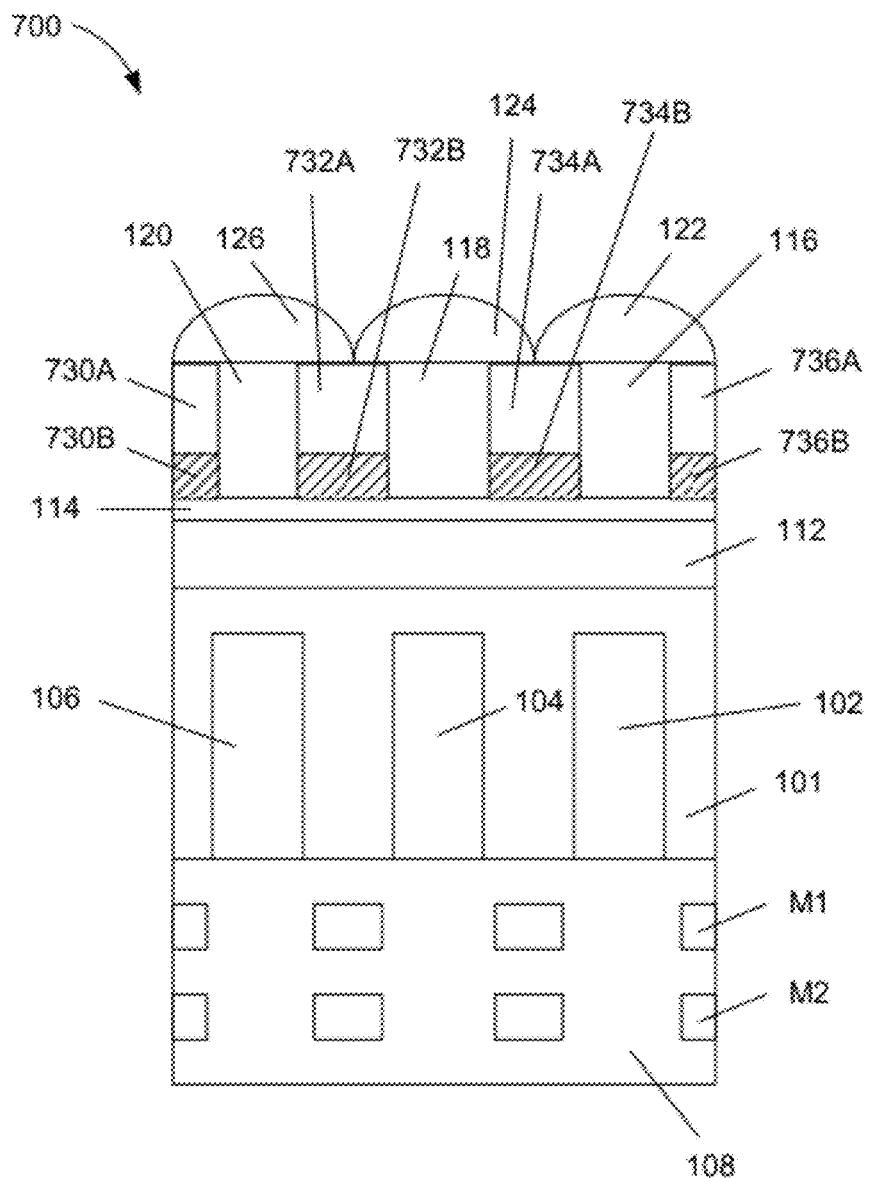
FIG. 7 is a cross-section view of an image sensor according to an embodiment of the present invention.

FIG. 7 is a cross-section view of a back side illuminated image sensor 700 according to an embodiment of the present invention. Image sensor 700 is similar to image sensor 100 of FIG. 1 with exception to the differences outlined below. An alternative embodiment of image sensor 700 may be similar to image sensor 200 of FIG. 2. A front side illuminated embodiment of image sensor 700 may be similar to image sensor 600 of FIG. 6.

Image sensor 700 differs from image sensor 100 in that a metal wall (730B, 732B, 734B, 736B) is coupled to a waveguide wall (730A, 732A, 734A, 736A) between the waveguide wall (730A, 732A, 734A, 736A) and the corresponding photosensitive element (106, 104, 102). Layers 112 and 114 are optional. The waveguide wall (730A, 732A, 734A, 736A) may comprise dielectric material or may be an air gap between color filters.

Depending on the incident angle, light may propagate along the waveguide wall. Without a metal wall, light in the waveguide may arrive at the edge of the photosensitive element and introduce crosstalk to the neighboring photosensitive elements. The metal wall alters the condition of the waveguide such that light propagating along the waveguide wall will be absorbed or blocked by the metal wall, thus further reducing crosstalk. Light propagating in the center of the waveguide is not absorbed by the metal wall. However, the waveguide wall is not completely replaced by the metal wall, since the total internal reflection conditions may then cease to exist. Extending the metal walls the full length right up to the micro lenses may result in substantial light absorption and thus significantly reduce the light detected by the photosensitive element.

Figure 8:
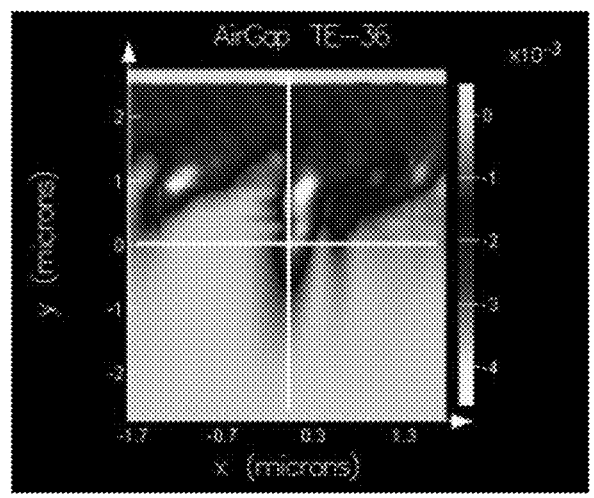
FIG. 8 is a side view of an image sensor illustrating computer-simulated light power density for air gap based waveguides according to an embodiment of the present invention.

For illustration, FIG. 8 is a side view of an image sensor 800 illustrating computer-simulated light power density in a pixel when the waveguide wall is an air gap. At 36° incident angle, the power of incident light is directed along the waveguide wall arriving at the edge of the pixel.

Figure 9:
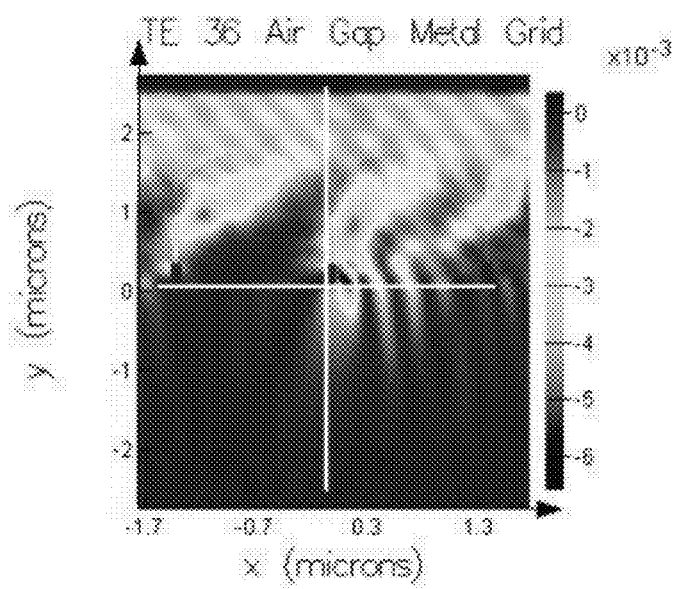
FIG. 9 is a side view of an image sensor illustrating computer-simulated light power density for air gap based waveguides where metal walls are coupled to the waveguide walls according to an embodiment of the present invention.

FIG. 9 is a side view of an image sensor 900 illustrating computer-simulated light power density in a pixel when a metal wall is coupled to the air gap waveguide wall. The metal wall is positioned at the origin of the coordinate (the center of the cross). It is apparent that the light propagating along the waveguide wall is effectively stopped by the metal wall preventing crosstalk to the neighboring photosensitive element.

The operations of the methods herein have been described as multiple discrete blocks performed in turn in a manner that may be most helpful in understanding embodiments of the invention. However, the order in which they are described should not be construed to imply that these operations are necessarily order dependent or that the operations be performed in the order in which the blocks are presented. Of course, the methods are example methods and other methods may be used to implement embodiments of the present invention.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An image sensor, comprising:
a semiconductor substrate having first and second sides;
an array of pixels disposed in or on the semiconductor substrate, the array of pixels comprising:
a plurality of photosensitive elements disposed in the semiconductor substrate and responsive to light incident through the first side of the semiconductor substrate;
a stack of metal layers disposed over a second side of the semiconductor substrate;
a plurality of color filters disposed over the first side of the semiconductor substrate; and
a plurality of waveguide walls disposed in the plurality of color filters, where the plurality of waveguide walls are surrounding the plurality of color filters forming a plurality of waveguides, wherein each of the waveguides is associated with a corresponding one of the photosensitive elements disposed in the semiconductor substrate on a one-to-one basis; and
a passivation layer disposed between the photosensitive elements and the waveguide walls.

2. The image sensor of claim 1, further comprising an antireflective layer disposed between the photosensitive elements and the waveguide walls.

3. An image sensor, comprising:
a semiconductor substrate having first and second sides; and
an array of pixels disposed in or on the semiconductor substrate, the array of pixels comprising:
a plurality of photosensitive elements disposed in the semiconductor substrate and responsive to light incident through the first side of the semiconductor substrate;
a stack of metal layers disposed over a second side of the semiconductor substrate;
a plurality of color filters disposed over the first side of the semiconductor substrate; and
a plurality of waveguide walls disposed in the plurality of color filters, where the plurality of waveguide walls are surrounding the plurality of color filters forming a plurality of waveguides, wherein each of the waveguides is associated with a corresponding one of the photosensitive elements disposed in the semiconductor substrate on a one-to-one basis,
wherein an individual color filter in the plurality of color filters and an individual waveguide wall in the plurality of waveguide walls are shifted with respect to a corresponding individual photosensitive element, in proximity to an edge of the array of pixels.

4. The image sensor of claim 3, wherein the distance between two adjacent waveguide walls decreases as the waveguide walls are further away from a center of the image sensor and getting closer to an edge of the image sensor.

5. An image sensor, comprising:
a semiconductor substrate having first and second sides; and
an array of pixels disposed in or on the semiconductor substrate, the array of pixels further comprising:
a plurality of photosensitive elements disposed in the semiconductor substrate and responsive to light incident through the first side of the semiconductor substrate;
a stack of metal layers disposed over a second side of the semiconductor substrate;
a plurality of color filters disposed over the first side of the semiconductor substrate; and
a plurality of waveguide walls disposed in the plurality of color filters, where the plurality of waveguide walls are surrounding the plurality of color filters forming a plurality of waveguides, wherein each of the waveguides is associated with a corresponding one of the photosensitive elements disposed in the semiconductor substrate on a one-to-one basis, wherein at least one of the waveguide walls is shared between two adjacent color filters along opposite sides of the waveguide walls.

6. The image sensor of claim 5, wherein the waveguide walls comprise a dielectric material.

7. The image sensor of claim 6, wherein the dielectric material comprises oxide.

8. The image sensor of claim 7, wherein the dielectric material comprises silicon dioxide.

9. The image sensor of claim 5, wherein the waveguide walls comprise an air gap.

10. The image sensor of claim 5, wherein the waveguide walls surrounding a given color filter comprise a shape selected from one of square, rectangle, triangle, circle, trapezoid, polygon, and elliptic.

11. The image sensor of claim 5, wherein the waveguide walls are shorter than the color filters.

12. The image sensor of claim 5, wherein the waveguide walls are substantially as tall as the color filters.

13. The image sensor of claim 5, further comprising a plurality of micro-lenses disposed on the plurality of color filters.

14. The image sensor of claim 5, wherein an individual color filter in the plurality of color filters and an individual waveguide wall in the plurality of waveguide walls are disposed on a respective photosensitive element, in proximity to a center of the array of pixels.

15. The image sensor of claim 5, wherein a metal wall is coupled to each of the waveguide walls between the waveguide walls and the photosensitive elements.

16. The image sensor of claim 5, wherein the waveguide walls do not extend above or below the color filters.

17. The image sensor of claim 5, wherein the array of pixels further comprises:
a plurality of metal walls coupled to the plurality of waveguide walls between the plurality of waveguide walls and the plurality of photosensitive elements.

* * * * *